United States Patent [19]

Dham et al.

[11] Patent Number: 4,534,104

[45] Date of Patent: Aug. 13, 1985

[54] MIXED DIELECTRIC PROCESS AND NONVOLATILE MEMORY DEVICE FABRICATED THEREBY

[75] Inventors: Vinod K. Dham, Fremont, Calif.; Edward H. Honnigford, Dayton; John K. Stewart, Jr., West Carrollton; Robert F. Pfeifer; Murray L. Trudel, both of Centerville, all of Ohio

[73] Assignee: NCR Corporation, Dayton, Ohio

[21] Appl. No.: 352,734

[22] Filed: Feb. 26, 1982

[51] Int. Cl.³ .................... H01L 21/22; H01L 21/26
[52] U.S. Cl. .................................. 29/571; 29/576 B; 29/577 C; 148/1.5; 148/187; 357/23.2; 357/91
[58] Field of Search ................... 148/1.5, 187; 29/571, 29/576 B, 577 C; 357/23 VT, 91

[56] References Cited

U.S. PATENT DOCUMENTS

| | | | |
|---|---|---|---|
| 4,229,755 | 10/1980 | Custode | 357/41 |
| 4,249,191 | 2/1981 | Hsia | 357/41 |
| 4,257,832 | 3/1981 | Schwabe et al. | 148/187 |
| 4,270,262 | 6/1981 | Hori et al. | 29/571 |
| 4,306,353 | 12/1981 | Jacobs et al. | 29/571 |
| 4,335,505 | 6/1982 | Shibata et al. | 148/1.5 |
| 4,342,149 | 8/1982 | Jacobs | 29/576 B |
| 4,370,798 | 2/1983 | Lieh et al. | 29/576 B |

Primary Examiner—Upendra Roy
Attorney, Agent, or Firm—J. T. Cavender; Casimer K. Salys

[57] ABSTRACT

A process for fabricating volatile and nonvolatile field effect devices on a common semiconductor wafer, and a unique composite structure for a nonvolatile memory device fabricated according to the process. A distinct feature of the process is the elimination of nitride from beneath any poly I layers while selectively retaining sandwiched and coextensive segments of nitride and poly II layers for the memory devices. In one form, the method commences with a wafer treated according to the general localized oxidation of silicon process, followed by a blanket enhancement implant and selectively masked depletion implants. The succeeding contact etch step is followed by a deposition of a poly I layer, a resistor forming implant and a patterned etch of the poly I layer. Thereafter, a first isolation oxide is grown, selective implants are performed to center the memory window, the memory area is etched, and the memory area is covered by a regrowth of a very thin memory oxide. The wafer is then coated with nitride and poly II, before undergoing a patterned plasma etch which successively and coextensively removes poly II and nitride in unwanted areas. Consequently, any nitride which remains is in a sandwiched arrangement with an overlying layer of poly II. The process inherently retains no nitride under any poly I layer, and thereby enhances the reliability of the complete IC. The composite nonvolatile memory device includes a poly II nonvolatile memory capacitor, a poly II depletion IGFET, and a poly I depletion IGFET over a single continuum of channel. The structural arrangement provides for selective access to the nonvolatile memory capacitor through the poly I IGFET during the write mode.

7 Claims, 9 Drawing Figures

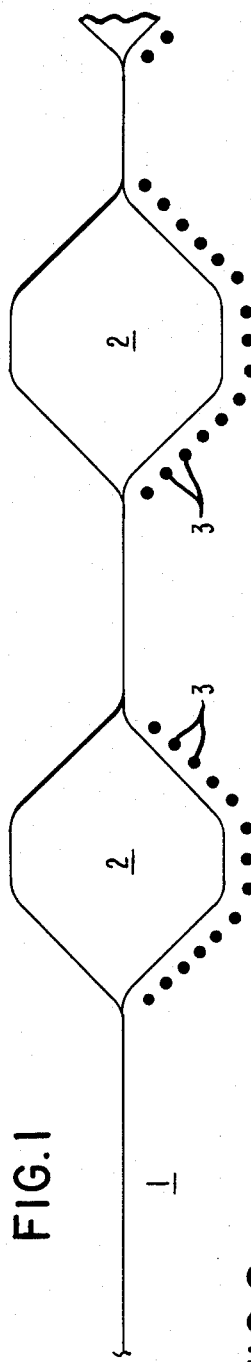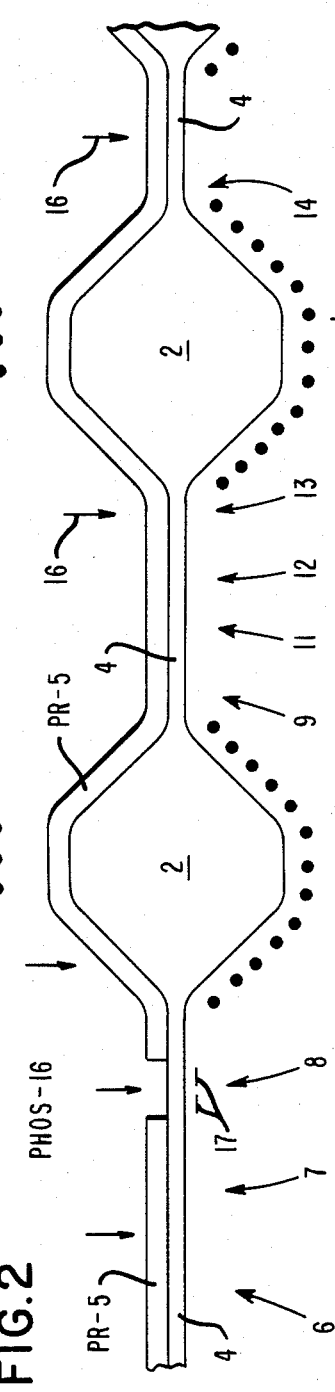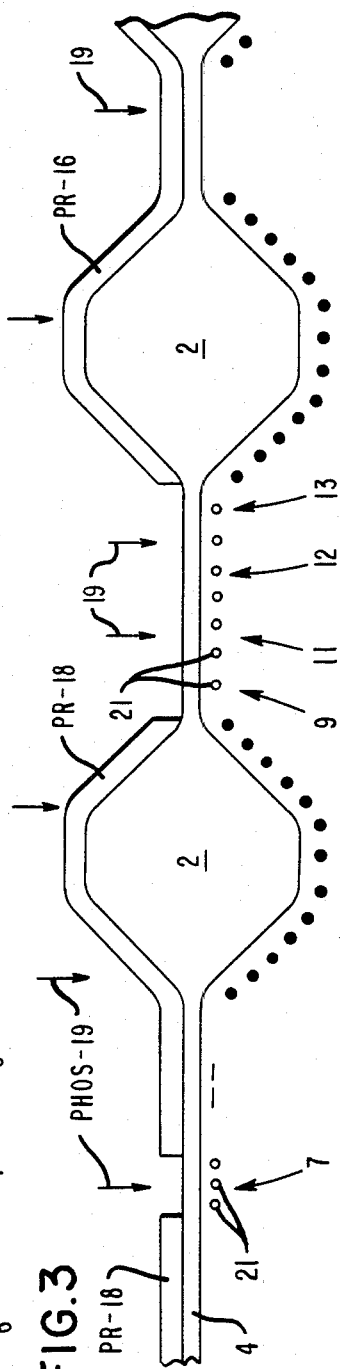

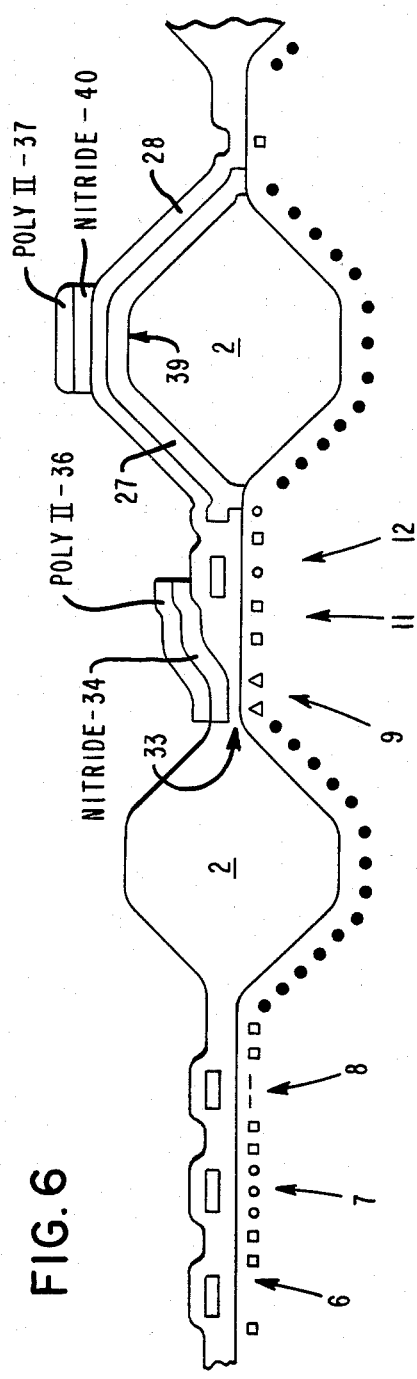
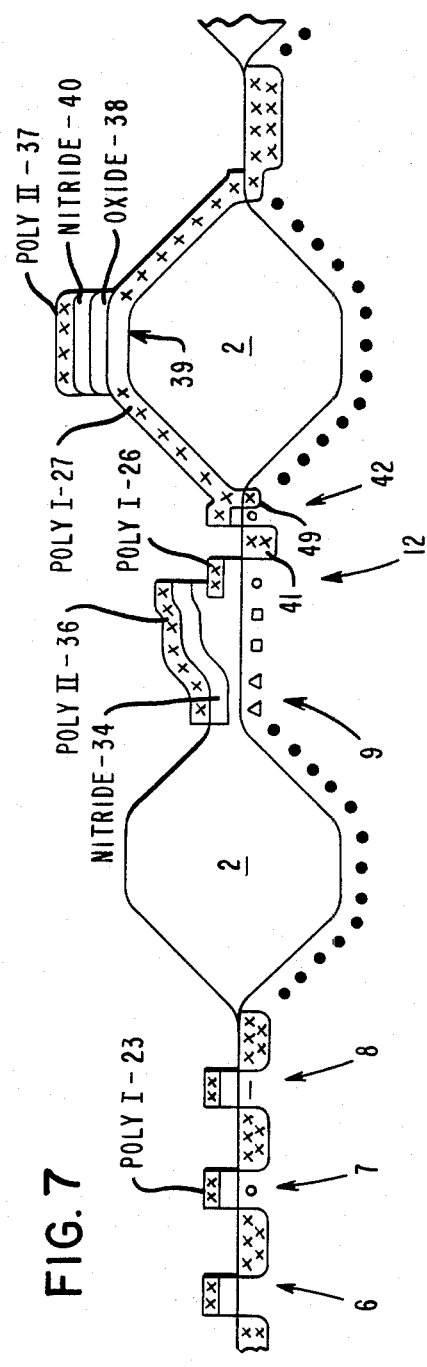
FIG. 6
FIG. 7

MIXED DIELECTRIC PROCESS AND NONVOLATILE MEMORY DEVICE FABRICATED THEREBY

BRIEF SUMMARY

The present invention relates to a process for fabricating volatile and nonvolatile integrated circuits on a common wafer, and a unique structure for a composite nonvolatile memory device formed by utilizing the process in a prescribed manner. The particular steps in the process establish an ordered sequence for creating insulated gate field effect transistors (IGFETs) and silicon-nitride-oxide-semiconductor (SNOS) type nonvolatile devices in a way that no silicon nitride (nitride) remains beneath a first polycrystalline silicon (poly I) layer, but is retained beneath segments of a second polycrystalline silicon (poly II) layer in a sandwiched and coextensive relationship therewith. The versatility of the process is reflected in the exemplary structure fabricated according to the process: a composite nonvolatile memory device consisting of a nonvolatile memory capacitor, a poly II depletion IGFET, and a poly I depletion IGFET over a common, extended channel. Though the process features are broadly applicable, the ensuing description will concentrate on utilizing the process to fabricate nonvolatile field effect elements on a common wafer with volatile field effect elements.

The distinctive features of the process appear in the steps following the sequence generally known as the selective oxidation of silicon. The departure from the prior art commences with the steps by which impurity ions are selectively implanted to form the depletion channel for the protected poly-to-substrate contacts. Thereafter, protected and unprotected poly-to-substrate contacts are etched through a layer of gate silicon dioxide (gate oxide). A poly I layer is then deposited, implanted to form resistive elements, and patterned with an etch step to leave IGFET gate electrodes, poly I interconnects and poly I resistors. After a depletion implant, a silicon dioxide (oxide) dielectric layer is grown on the exposed poly I surface to form a first isolation oxide layer. The memory capacitor areas of the monocrystalline silicon substrate (substrate) are subsequently defined and treated with a selective implant to adjust or center the alterable memory threshold window. The formation of the memory capacitor and associated gate regions of the composite memory device follows, beginning with a selective etch to the substrate surface and followed by the growth of a very thin layer of memory silicon dioxide (memory oxide). The wafer is then covered by successive depositions including a memory silicon nitride (memory nitride) layer and a poly II layer. The pattern and depth of the etch which follows retains segments of the nitride layer only where segments of the poly II layer are also retained. Consequently, the nitride and poly II segments exhibit a sandwiched and coextensive relationship. Normally, the sandwiched segments serve as either memory devices or dopant barriers over poly I resistive elements.

With the structure of the volatile and nonvolatile elements substantially completed, the embodying process prescribes an oxide etch step to remove exposed gate oxide and first isolation oxide in preparation for the conductive doping step which follows. Dopant is then diffused into the exposed areas of poly I, poly II and substrate, to form self-aligned source/drain (S/D) regions, contact diffusions, other ohmically conductive diffusions in the substrate, and ohmically conductive interconnects where poly I and poly II is exposed. Processing of the wafer is completed by forming a second isolation oxide layer, creating contact cuts, subjecting the wafer to hydrogen annealing and forming a patterned metallization layer.

The nonvolatile memory device for which the process is particularly suited is characterized by a composite structure over an extended channel region in the substrate. At one end of the channel is a nonvolatile memory capacitor, consisting of a poly II-nitride sandwiched layer and a memory oxide layer over the substrate. The sandwiched layer extends beyond the memory oxide layer and onto a channel segment operable in the depletion mode, eventually overlapping the electrically isolated poly I layer of the device. The poly I layer covers the last segment of the channel and is used to selectively couple the immediately preceding depletion mode segment to a diffused contact at its opposite side.

These and other features of the process and structure briefly described above will be more fully developed in the ensuing description of the preferred embodiment.

DESCRIPTION OF THE DRAWINGS

FIGS. 1–8 are schematic representations of wafer cross-sections depicted as they would appear at various stages in the fabrication process.

DETAILED DESCRIPTION

Figure 4:
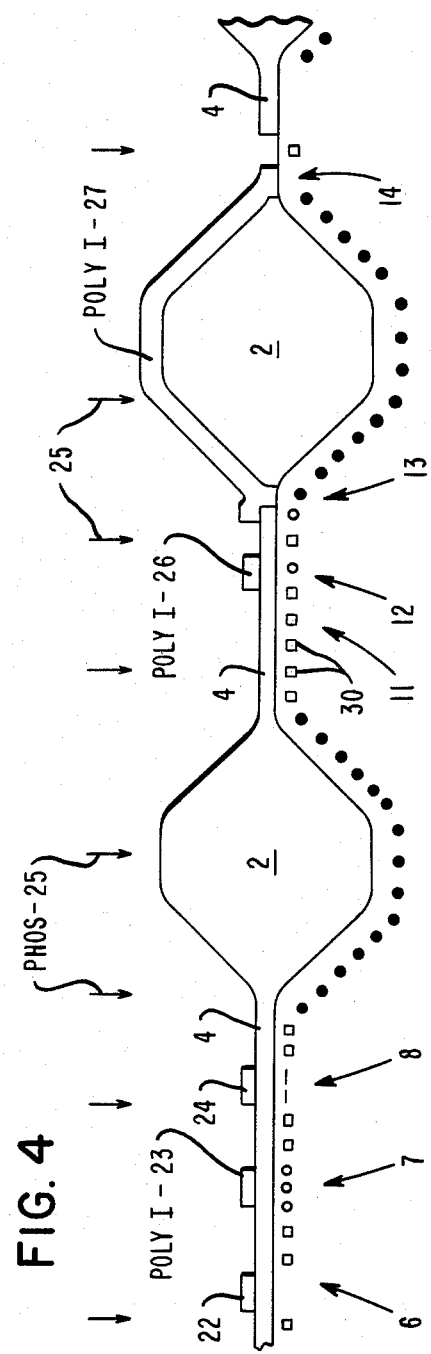

The present invention will be described and illustrated in the context of a preferred embodiment used to fabricate an integrated circuit (IC). The description begins with an overview of the technique known as the selective oxidation of silicon and concludes with a brief highlight of the unique and beneficial features inherent in the process as well as a detailed development of the preferred composite nonvolatile memory device formed by utilizing the process.

It should be recognized that the drawings are not scale representations, in that they merely illustrate the structural implications at various stages in the process. Elements are indicated by the same reference numerals throughout the figures.

The sequence of the present process is particularly suited for the simultaneous fabrication of IGFETs and SNOS type memory elements on a common IC wafer. In part, the process was developed to fabricate the memory cells disclosed in U.S. Pat. No. 4,271,487, the subject matter of which is incorporated herein by reference. One aspect of the present invention is also related to U.S. Pat. No. 4,397,076 by inventors Honnigford et al., and assigned to the assignee of the present invention. Another aspect relates to copending U.S. patent application Ser. No. 158,343, filed June 10, 1980, by inventors Trudel et al., assigned to the present assignee, which application is now abandoned. Since these teachings may be of some value to one practicing the present invention, the subject matter in both is hereby incorporated by reference.

At this point it may be of value to briefly describe four U.S. Patents which exhibit some similarities in either process, structure or objective to the subject matter of the present invention. The most recent is U.S.

Pat. No. 4,249,191, issued to Hsia. The Hsia patent discloses a wafer structure containing both MOS and SNOS transistors on a common substrate. However, the description of the process by which the IC structure is formed is constrained to a pair of short paragraphs. Given this relatively abbreviated process description in the Hsia patent, and the absence of multiple poly layers in the final structure, the relevance of Hsia to the present invention is no doubt limited to its pursuit of a common objective, namely, the selective retention of nitride on an IC wafer.

The next reference of relevance is U.S. Pat. No. 4,229,755, issued to Custode. This patent also describes a process for fabricating wafers having both MOS and SNOS devices. However, the teaching differs from the present invention by way of the steps in the process sequence, the use of an epitaxial rather than a bulk substrate, the absence of multiple poly layers, etc. It is, therefore, merely illustrative of the related art.

The last two references are U.S. Pat. No. 3,897,282, issued to White, and U.S. Pat. No. 3,913,211, issued to Seeds et al. Again, though some aspects of the process sequence are similar to the present invention, neither process defines a sequence of steps which form both nitride and multiple poly layers during the fabrication of IGFETs and SNOS type devices on a common wafer.

The composite nonvolatile memory device, as well as its structural features and performance characteristics, will be described separately at the conclusion of the process development which follows.

To thoroughly understand the various facets of the present invention as it relates to processes, one must first recognize the fundamental objectives sought during its development. The principal consideration was to develop a process for fabricating IC wafers having both nitride type nonvolatile memory elements and IGFETs with poly I level gate electrodes on a common wafer in such a way that no nitride is retained beneath the poly I layer. In addition, to minimize the retention and endurance degradation caused by the use of long-term high-temperature cycles late in the process, it was preferred that the nonvolatile memory elements be formed after most high temperature process steps were completed. From the broad perspective of the complete process, attempts were made to minimize the number of masks and process steps while retaining compatibility with dry processing. Furthermore, it was preferred that the process allow for selective adjustments to IGFET and SNOS thresholds, whether it be by implant or gate oxide thickness variations. With an understanding of the objectives sought here and in the related art one can now consider the individual steps of the preferred process as they are described and illustrated hereinafter.

Figure 8:
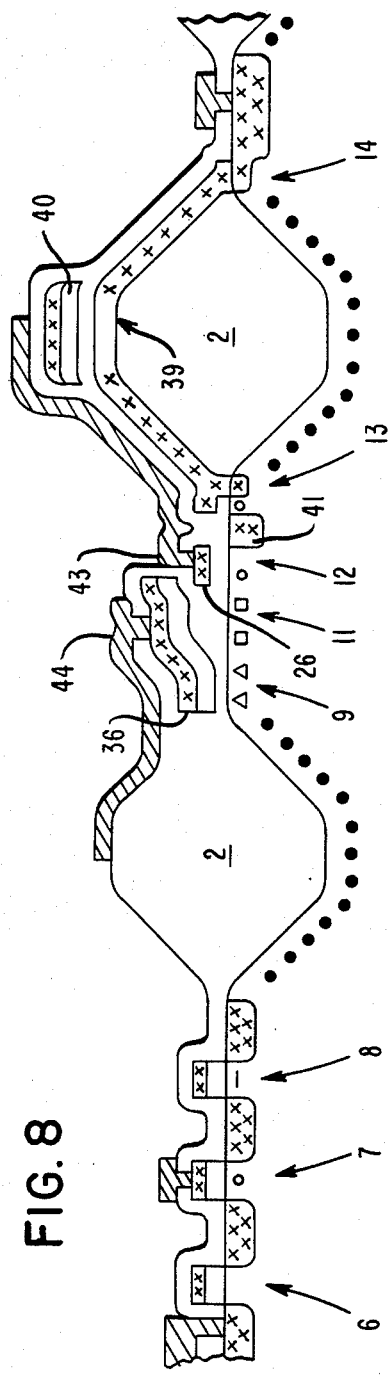

The sequence and steps comprising the preferred process may be better appreciated after giving brief consideration to the final composite structure illustrated by cross-sectional schematic in FIG. 8. Note that the completed IC includes a poly I enhancement IGFET at location 6, a poly I depletion IGFET at location 7, a poly I zero threshold IGFET at location 8, a poly II nonvolatile memory capacitor at location 9, a poly II depletion IGFET at location 11, a poly I depletion IGFET at location 12, a protected poly-to-substrate contact at location 13, and an unprotected poly-to-substrate contact at location 14. The composite nonvolatile memory device is shown individually in FIG. 9. Though the active elements depicted in FIG. 8 are developed in a serial, two-dimensional arrangement across the substrate to clarify the effects of the process, one no doubt recognizes that a preferred arrangement would extend the various elements into the third dimension and make appropriate changes in the shapes and relative positions of the constituent layers and materials.

The overall process begins with a semiconductor wafer (substrate) of monocrystalline silicon cut to have a crystal orientation of <100>. The substrate is p-type and has a bulk resistivity in the range of 15–20 ohm-cm. The devices formed are to be n-channel and assumes the utilization of an approximately −2.5 volt substrate bias.

The schematic in FIG. 1 shows the semiconductor wafer after it has been subjected to the selective oxidation of silicon process. During the course of the general sequence, the surface of substrate 1 is first oxidized, then coated with layers of nitride and photoresist, photolithographically processed using mask #1, subjected to a field implant of boron ions with an energy of approximately 60 keV and concentration of approximately $1 \times 10^{14}$ cm$^{-2}$, etched to pattern the nitride, and subjected to oxidation by which the field oxide is grown to a thickness of approximately 16,000 Angstroms. The field oxide is shown at reference numeral 2, with the field implant symbolically shown by dots 3. Following the selective formation of field oxide regions 2, the oxidized upper layer of nitride, the nitride mask layer, and the underlying oxide layer are etched away to leave the structure depicted in FIG. 1.

Referring to FIG. 2, the steps peculiar to the embodying process generally commence with the growth of a relatively thin gate oxide layer, 4, on the exposed surfaces of substrate 1, these surfaces being commonly known as active regions, to a thickness of approximately 775 Angstroms. Thereafter, the complete wafer is subjected to a blanket enhancement implant of boron ions with an energy of approximately 40 keV and concentration of approximately $4 \times 10^{11}$ cm$^{-2}$. The implant ions penetrate gate oxide layer 4 to create an enhancement IGFET threshold voltages of +1 volts for all the active regions of the substrate surface subjected to the implant. Since this step involves a blanket implant of the wafer, the presence of the dopant is not individually designated in the figures.

The succeeding step in the process is also illustrated with reference to FIG. 2. After the application of photoresist (PR) layer 5, mask #2 is used to photolithographically expose gate oxide layer 4 at location 8. The wafer is then subjected to a phosphorus ion implant, symbolically represented by arrows 16, having an energy of approximately 100 keV and concentration of approximately $6 \times 10^{11}$ cm$^{-2}$. Since PR layer 5 serves as an implant barrier while gate oxide 4 does not, only location 8 is subjected to the depletion implant of phosphorous ions. As a consequence of the implant, the threshold of the IGFET to be fabricated at 8 is now shifted by 1.5 volts from the +1 volt blanket implant level to approximately −0.5 volts. For purposes of an n-channel circuit, this constitutes an inversion voltage corresponding to an IGFET generally classified as having a zero threshold voltage. The implanted phosphorus is shown in FIG. 2 by dashes 17.

The next significant step in the embodying process is shown with reference to FIG. 3. At that point in the sequence, PR layer 5 has been stripped, and a new PR layer, designated 18, has been applied and photolithographically patterned using mask #3. As shown in the figure, a phosphorous implant, represented by arrows 19, introduces phosphorous impurity into substrate 1 in the active region designated for the IGFET to be formed at 7, as well as into the areas designated for the poly II nonvolatile memory capacitor at 9, the poly II depletion IGFET at 11, the poly I depletion IGFET at 12, and the protected poly-to-substrate contact at 13. The phosphorous ions are driven into the substrate areas not covered by PR 18 with an energy of approximately 140 keV and concentration of approximately $1.3 \times 10^{12}$ cm$^{-2}$. Again, the ions penetrate gate oxide layer 4 but not PR layer 18. The areas implanted with phosphorous are marked in the figures by small circles 21.

It should be noted at this point that the purpose for phosphorus impurities 21 varies with the area affected. The poly I depletion IGFET to be formed at 7 has its inversion voltage threshold shifted from the +1 volt level attributable to boron implant to its nominal operating range of −2.5 to −3 volts. The memory region associated with the poly II nonvolatile memory capacitor to be formed at 9, and region associated with the poly II IGFET at 11, are also implanted at this time, to minimize alignment problems at the memory mask level. The effect of the implant on the poly I depletion IGFET to be formed at 12 is similar to that experienced by the one at 7, i.e., having its threshold voltage for inversion shifted into the range of −2.5 to −3 volts.

The area around the protected poly-to-substrate contact at 13 is also implanted with phosphorus 21. This insures ohmic continuity between diffused regions 41 and 49 (FIG. 7) without exposing the surface of substrate 1 at location 13 to the etchants used to pattern the poly I layer. FIG. 4 shows that a protective gate oxide layer, 4, separates any poly etchants from the surface of substrate 1 in the active area of the memory device. In contrast, note the exposure of substrate 1 for the unprotected poly-to-substrate contact at location 14. Other implications of making a protected contact at 13 are fully described in the now U.S. Pat. No. 4,397,076.

The structure schematically shown in FIG. 4 illustrates the shape of the wafer after it has been subjected to some additional steps of processing. Proceeding from FIG. 3, PR layer 18 is stripped and a new PR layer (not shown) is applied over the wafer. Thereafter, mask #4 is used to photolithographically designate the contact cut areas shown at 13 and 14. The exposed gate oxide in the contact cut areas is then etched away in a conventional manner with a hydrofluoric acid (HF) based etchant. After the etch is completed, a first layer of polycrystalline silicon (poly I) is deposited to a thickness of approximately 4,000 Angstroms. Since the cell is contemplated to contain resistive elements, the poly I layer is subjected to a light doping for the subsequent formation of poly I resistor elements. A suitable implantation involves phosphorous ions having an energy of approximately 110 keV and concentration of approximately $1.6 \times 10^{14}$ cm$^{-2}$.

In progressing toward the structure shown in FIG. 4, the resistively doped poly I layer is covered by another PR layer (not shown). This PR layer is photolithographically processed using mask #5. The poly I not covered by PR is then etched away using a planar plasma etcher with a suitable dry etchant gas, such as carbon tetrachloride or sulfur hexafluoride. The type of etchant gas depends on the equipment utilized.

The structure in FIG. 4 shows the outcome, namely, poly I gate electrode 22 for the enhancement IGFET to be formed at 6, poly I gate electrode 23 for the depletion IGFET to be formed at 7, and poly I gate electrode 24 for the zero threshold IGFET to be formed at 8. Continuing across the wafer, note the retention of poly I gate electrode 26 for the depletion IGFET to be formed at 12. Note, also, that the contact between poly I segment 27 and substrate 1, at location 13, is of the protected type. The low leakage current associated with such a contact is preferred in the memory region of the wafer. In contrast, poly I segment 27 also makes an unprotected contact with substrate 1 at location 14. The latter form is more conventional.

The preferred process includes an additional phosphorus ion implant step, depicted schematically in FIG. 4 by arrows 25, performed with an energy of approximately 110 KeV and concentration of approximately $1.3 \times 10^{12}$ cm$^{-2}$. Because the phosphorus ions penetrate the gate oxide but not the poly I layer, the substrate areas implanted consist of those not covered by a poly I layer. For the embodiment, the doped areas of the substrate are designated by small blocks 30 in FIG. 4. Being two orders of magnitude less than the dose by which the poly I layer resistivity was established, phosphorus implant 25 has negligible effect on the resistivity of any poly I layer used as a mask. The substrate areas subjected to the phosphorus implant, aside from locations 9 and 11, are not affected materially in that they will eventually be subjected to diffusion doping. The threshold voltage for region 9 is established by the combined effects of the various implants into that area.

The purpose of the additional phosphorus implant is to drive the poly II depletion IGFET to be formed at location 11 into deeper inversion, creating a FET with a threshold of approximately −12 volts. Though the former −3 volt range is generally suitable for the basic operation of the composite nonvolatile memory device, the −12 volt threshold is preferred because it increases the threshold voltage window through which the nonvolatile memory capacitor at 9 can be probed during retention testing and readily overcomes any charge trapped in the IGFET at 11.

After the phosphorus ion implant in FIG. 4, the substrate is subjected to an oxidation step to grow a first isolation layer of silicon dioxide dielectric. The first isolation oxide, 28, is grown to a thickness of approximately 1200 Angstroms over exposed poly I, and to a lesser thickness where gate oxide 4 and field oxide 2 are exposed. The continuity of the dielectric insulation caused by first isolation oxide is visually apparent in FIG. 5 of the drawings.

Figure 5:
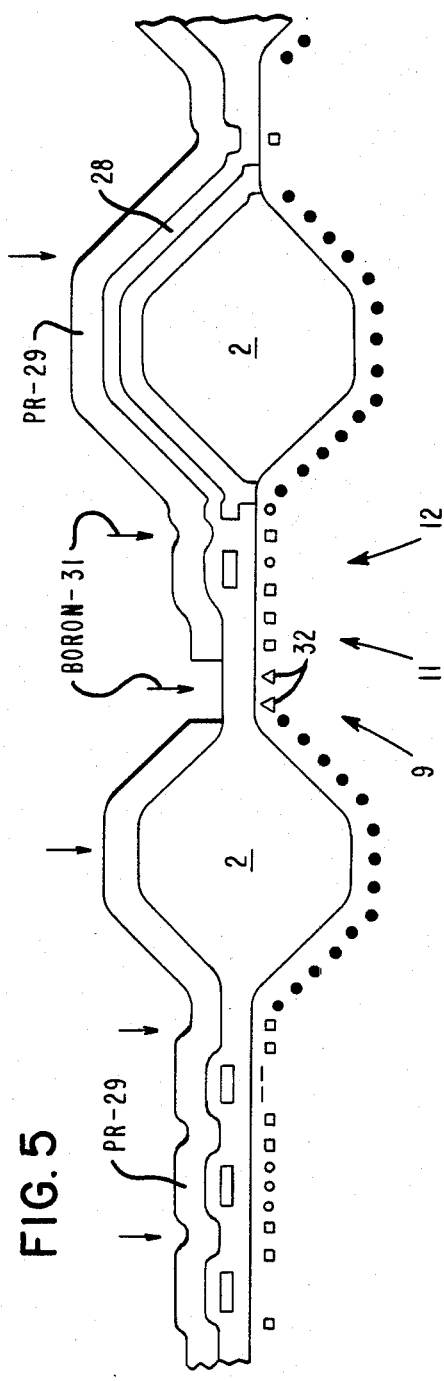

PR layer 29 is then deposited and photolithographically processed using mask #6 to expose the oxide at 9, the location of the proposed poly II nonvolatile memory capacitor. A boron ion implantation step follows, introducing boron ions with an energy of approximately 70 keV and concentration of approximately $1.4 \times 10^{12}$ cm$^{-2}$ into the substrate in areas not covered by PR layer 29. In FIG. 5 the implanted boron ions are symbolically shown by triangles 32. The purpose of the memory area implant step is to adjust the memory window of the poly II nonvolatile memory capacitor at 9 so that the window ranges from −6 volts to +6 volts, with a center of approximately zero volts.

Without removing patterned PR layer 29, the wafer is then subjected to an HF based etchant until the surface of the substrate is exposed. No doubt one recognizes that the substrate serves as an etchant stop for the HF based etchant. Thereafter, a very thin layer of silicon dioxide, generally referred to as memory oxide, is thermally grown from the substrate as shown in FIG. 6.

Preferably, the thickness of memory oxide on the exposed surface of substrate 1 is approximately 20 Angstroms. The memory oxide for the nonvolatile memory capacitor at 9 is designated by reference numeral 33.

Referring further to FIG. 6, with the memory oxide in place, the wafer is coated with a deposition of nitride to a thickness of approximately 380 Angstroms. Following that deposition, the wafer is further covered by a layer of approximately 3,000 Angstroms of polycrystalline silicon (poly II). The poly II layer is followed by a PR layer (not shown) which is photolithographically processed using mask #7. A suitable planar plasma dry etch is then used to remove any exposed poly II. The etch is continued through the now-exposed nitride layer, ceasing only when it reaches an underlying oxide. The structural result is a sandwiched and self-aligned composite layer of poly II and nitride at various locations on the wafer surface. For instance, FIG. 6 shows that the poly II-nitride sandwich of layer segments 36 and 34 is retained over elements at locations 9 and 11. In addition, a sandwich of poly II layer segment 37 and nitride layer segment 40 is retained over area 39 of poly I layer segment 27 to define the pattern of the underlying poly I resistor.

The wafer structure in FIG. 6 is then subjected to an oxide etch step using HF. The etch conditions are selected to remove exposed gate oxide and first isolation oxide without excessively reducing the thickness of field oxide 2. Since polycrystalline and monocrystalline silicon are not materially attacked by HF, they serve as etchant masks and etchant stops. At the conclusion of the oxide etch, the wafer is subjected to a phosphorous deposition and a thermal diffusion to drive phosphorous dopant into any exposed areas of polycrystalline and monocrystalline silicon. The diffusion and subsequent process steps are held to 900° C. or less to minimize degradation of the nonvolatile memory capacitor formed at location 9. The outcome of the diffusion appears in FIG. 7, where the symbols "X" designate areas of silicon which are doped n-type with a nominal resistivity in the range of 15–50 ohms per square.

Consider the structure schematically in FIG. 7 further. The poly I layer resistor at 39 is shown connected at opposite ends to electrical interconnects formed in poly I layer 27. The patterns of the dopant diffusions also show that diffused regions 41 and 49 are conductively coupled through the depletion channel at 42 in the manner of the aforementioned protected poly-to-substrate contact. The self-alignment of the gates for the IGFETs at 6, 7, 8 and 12 is clearly evident. So too is the doping of the poly I and poly II gate electrodes.

The wafer is shown in FIG. 8 as it appears after metallization. Note the presence of the poly I enhancement IGFET at 6, the poly I depletion IGFET at 7, the poly I zero threshold IGFET at 8, the poly II nonvolatile memory capacitor at 9, the poly II depletion IGFET at 11, the poly I depletion IGFET at 12, the protected poly-to-substrate contact at 13, and the unprotected poly-to-substrate contact at 14. Also note the presence of metal contacts 43 and 44, respectively attached to poly I gate electrode 26 of the IGFET at 12 and to poly II electrode 36 of the devices at 9 and 11.

Though the process steps between the structures in FIG. 7 and FIG. 8 are fairly conventional, it may be of some value to briefly summarize the sequence. A second isolation oxide layer is created using the combination of a thermal growth of oxide, to ensure a conforming dielectric, followed by a deposition of oxide. The thermal growth forms a layer approximately 800 Angstroms thick on the poly and approximately twice that thickness on the monocrystalline silicon, while the deposition leaves approximately 6,000 Angstroms. Using mask #8 and normal photolithographic steps contact cuts are etched through the oxides to the poly and substrate surfaces using an HF based etchant. Thereafter, the wafer is coated with approximately 6,000 Angstroms of phosphorus doped oxide, subjected to a low temperature wet oxygen reflow, and etched using photolithographic processing with mask #8A. The contact openings in mask #8A are slightly larger than those in mask #8. A second contact etch follows. The use of two masks also minimizes the possibility of shorts at points where mask #8 has minor defects. The making of the contact cuts is followed by a hydrogen annealing step. The annealing is performed by following the procedure described in the copending U.S. patent application Ser. No. 158,343, which application is now abandoned. The final steps leading to the structure in FIG. 8 involve an aluminimum/silicon metal deposition to approximately 10,000 Angstroms, a photolithographic process with mask #9, and a metal etch to define the metallization pattern according to mask #9.

With an understanding of the complete process at hand, it is appropriate to briefly review some of the features which make the process unique and beneficial. Referring to the structure in FIG. 8, note the absence of nitride beneath any poly I layer and its coextensive presence under any retained segments of the poly II layer. As a consequence, the poly I IGFETs at 6, 7, 8 and 12 are fabricated on a common substrate with the nonvolatile memory capacitor at 9 without assuming the risk of dual dielectric type charge trapping effects in poly I IGFETS. Furthermore, the structure shows that other retained segments of nitride, such as 40, are adequately designed to prevent detrimental charge trapping effects. For instance, nitride segment 40 is separated from the poly I resistor at 39 by 1200 Angstroms of isolation oxide. Note also, that modulation effects between the poly II layer and the poly I resistor at 39 are reduced by the combination of nitride and oxide layers. Charge trapping effects in the IGFET at 11 are controlled by process parameters, such as the heavy depletion implant in the substrate at location 11. Continuing with other features, note that the final structure has self-aligned gates (locations 6, 7, 8 and 12), selectively defined poly I resistors (location 39), multiple poly layers, selectively adjusted IGFET thresholds (locations 6, 7 and 8) and a centered memory window for the nonvolatile memory capacitor at 9. A review of the process will also disclose that the process sequence insures minimum degradation of the nonvolatile memory capacitor characteristics by defining a sequence in which the steps following the nitride deposition use temperatures of 900° C. or less.

Figure 9:
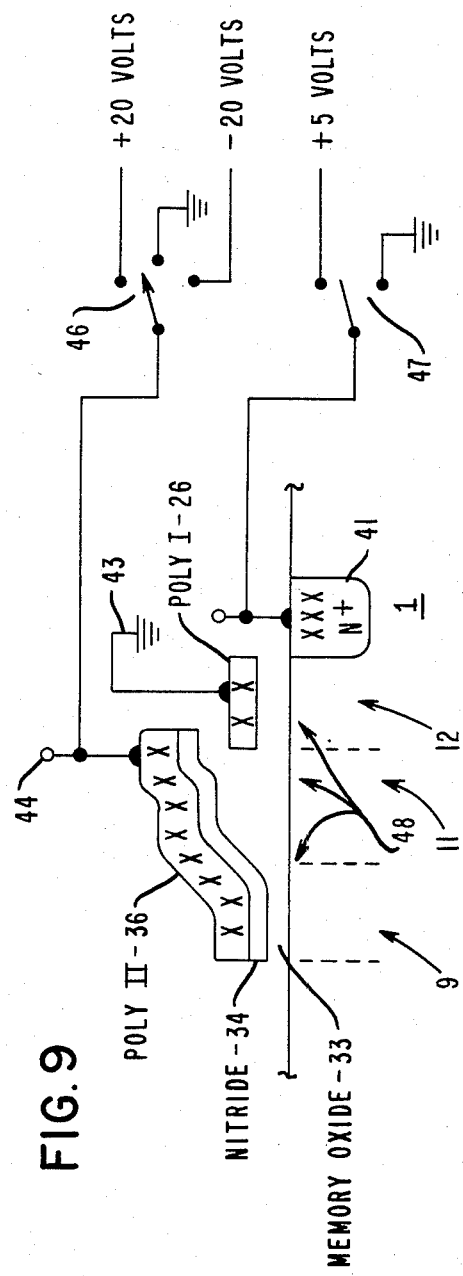
FIG. 9 contains a magnified schematic of the exemplary nonvolatile memory device formed by the process.

FIG. 9 presents an enlarged view of the composite nonvolatile memory device. Though the structure of the nonvolatile memory device in FIG. 9 is exemplary of the structures which the present process suitably forms, it should also be recognized that this particular arrangement of the device structure has inherent features in its own right.

To understand the importance of the various features in the nonvolatile memory device shown, one is again directed to the description of the memory cell in U.S. Pat. No. 4,271,487. Upon considering the write operation utilized in a cell of that configuration, one undoubtedly recognizes the importance of minimizing capacitance on the lines and nodes coupled to the nonvolatile memory capacitor if bootstrapping is to effectively inhibit the writing of selected capacitors in the cell.

Using the schematic structure of the composite nonvolatile memory device in FIG. 9, and the operating sequence described in U.S. Pat. No. 4,271,487, the operation of the present device, as well as the effects of extraneous capacitance, can be considered. Recall that during the write operation a +20 volt signal, represented in FIG. 9 by switchable voltage source 46, is coupled to electrode 44. If the nonvolatile memory capacitor at location 9 is to be written, diffused region 41 is held at ground potential by switchable voltage source 47 to place the full 20 volts across the nonvolatile memory capacitor element and alter its threshold voltage. This occurs because the IGFETs at 11 and 12 are depletion mode devices, with respective threshold voltages of −12 and −3 volts, which couple the ground potential at diffusion 41 via composite channel 48 to the substrate surface at nonvolatile capacitor 9.

If the nonvolatile memory capacitor at location 9 is not to be written during the presence of the +20 volt signal, diffused region 41 is held at approximately +5 volts by voltage source 47. In that situation, the application of the +20 volts causes the surface potential of substrate 1 at locations 9 and 11 to initially rise to a magnitude comparable to the threshold of the IGFET at 12. This sequence of events turns the IGFET at 12 off and effectively decouples the nonvolatile memory capacitor at 9 from diffusion 41. Thereafter, the surface potential of substrate 1 at location 9 is substantially equal to +20 volts. The residual voltage difference between substrate 1 and poly II layer 36 is insufficient to trap charge and thereby alter the threshold of the nonvolatile memory capacitor element at 9.

It is no doubt clear that effective writing of the nonvolatile memory capacitor will not be possible if a substantial part of the 20 volt signal applied to electrode 44 appears across a capacitor other than the one defined between poly II layer 36 and substrate 1 at location 9. Therefore, it is very important that the equivalent capacitance between the surface of substrate 1 at location 9 and ground potential be significantly less than that of the memory dielectric itself. Only in this way will the division of the voltage be appropriate to selectively inhibit the writing of the nonvolatile memory capacitor element at 9.

The information stored in the nonvolatile memory capacitor is extracted in the manner described in the aforementioned U.S. Pat. No. 4,271,487. Generally, reading of the stored state involves a sensing of the differences in relative capacitance at individual nonvolatile memory capacitors which have and have not been written. The nonvolatile memory capacitors which have been written exhibit a significantly smaller effective capacitance, perceived from diffusion 41, by the absence of an inverted region in substrate 1 immediately below memory oxide 33. The implementation of such sensing in a practical circuit is described and shown in the aforementioned U.S. Patent.

With the operational features at hand, consider some of the structural advantages inherent in the present nonvolatile memory device. First, note that the multiple poly layers, poly I and poly II, overlay a potentially continuous channel, 48, extending from the nonvolatile memory capacitor at 9 to the conductively doped diffusion 41. The absence of nitride under poly I layer 26 and the stepped overlap of the poly II-nitride layer combination over the poly I layer should also be recognized. These arrangements of the structure permit selective decoupling of the nonvolatile memory capacitor from the diffused contact 41 with a minimum effective capacitance between the nonvolatile memory capacitor and ground potential. This, one undoubtedly recalls, is necessary to selectively inhibit writing. Though alternate structural arrangements are possible, they introduce inherent structural or operational disadvantages. For instance, if one were to attempt to place the nonvolatile memory capacitor at 9 immediately adjacent the depletion IGFET at 12, the allowable tolerances for mask alignments would risk dielectric failures and electrical shorts between the multiple poly layers. If, on the other hand, the region corresponding to location 11 were replaced with a diffusion to couple the elements now at 9 and 12, the relatively large capacitance created by the diffusion would severely degrade the write inhibit characteristics of the nonvolatile memory capacitor at 9. In contrast, note the overlap of poly II layer 36 over poly I layer 26 in location 12 with complete electrical isolation therebetween. It is now apparent that the use of multiple poly layers and intermediate poly II depletion type IGFET at 11, according to the present process, overcomes the classic difficulties without sacrificing performance or consuming excess chip area.

We claim:

1. A process for fabricating volatile and nonvolatile field effect devices on a common semiconductor substrate, comprising the steps of:
   separating a silicon substrate into distinct active regions;
   doping selected areas in said active regions to adjust the respective threshold voltages;
   forming a patterned first layer of semiconductor material on the substrate;
   forming a first isolation dielectric layer;
   patterning said first isolation dielectric layer to position a memory element;
   forming a memory dielectric at the position of the memory element;
   forming a second dielectric layer;
   forming a second layer of semiconductor material;
   patterning said second layer of semiconductor material and said second dielectric layer;
   removing selected areas of said first isolation dielectric; and
   doping selected areas of said substrate and semiconductor material layers.

2. The process recited in claim 1, wherein said second dielectric layer contains silicon nitride.

3. The process recited in claim 2, wherein:
   said step of forming a patterned first layer of dopable material includes the doping of said first layer of dopable material sufficiently to form a resistive element;
   said pattern in said first layer of dopable material includes a segment suitable to form a resistive element; and
   said step of patterning said second layer of dopable material and said second dielectric layer retains coextensive layers over the memory element and the resistive element.

4. The process recited in claim 3, wherein:
   said step of doping selected areas in said active regions is comprised of a blanket enhancement implant followed by selected depletion implants; and the step of doping said substrate at the position of the memory element to center a memory window, is included after said step of forming a first isolation dielectric layer.

5. The process recited in claim 4, wherein:
said step of patterning said first isolation dielectric layer to position the memory element comprises a selective etch through said first isolation dielectric layer to expose the underlying substrate surface; and
said step of forming a memory dielectric comprises the thermal growth of a thin memory oxide on said exposed substrate surface.

6. The process recited in claims 1, 2, 3, 4 or 5, including the further step of:
exposing selected poly-to-substrate contact areas of said substrate, after said step of doping selected areas in said active regions.

7. The processes recited in claim 6, wherein said processes are extended by the steps of:
forming a second isolation dielectric layer;
removing selected areas of said second isolation dielectric layer to expose areas of poly and substrate;
annealing in a hydrogen environment; and
depositing a patterned metallization layer.

* * * * *